United States Patent (10) Patent No.: US 9,654,156 B2
Liu et al. (45) Date of Patent: May 16, 2017

(54) NONLINEAR COMPENSATING APPARATUS AND METHOD, TRANSMITTER AND COMMUNICATION SYSTEM

(71) Applicant: FUJITSU LIMITED, Kawasaki-shi, Kanagawa (JP)

(72) Inventors: Bo Liu, Beijing (CN); Weizhen Yan, Beijing (CN); Lei Li, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/884,239

(22) Filed: Oct. 15, 2015

(65) Prior Publication Data

US 2016/0036473 A1 Feb. 4, 2016

Related U.S. Application Data

(63) Continuation of application No. PCT/CN2014/075027, filed on Apr. 10, 2014.

(30) Foreign Application Priority Data

Apr. 15, 2013 (CN) .......................... 2013 1 0128976

(51) Int. Cl.
*H04B 1/04* (2006.01)
*H04B 1/62* (2006.01)
*H04L 25/03* (2006.01)

(52) U.S. Cl.
CPC ............ *H04B 1/0475* (2013.01); *H04B 1/62* (2013.01); *H04L 25/03343* (2013.01); *H04B 2001/0425* (2013.01)

(58) Field of Classification Search
CPC H04B 1/0475; H04B 1/62; H04B 2001/0425; H04L 25/03343
See application file for complete search history.

(56) References Cited

U.S. PATENT DOCUMENTS

2001/0050592 A1* 12/2001 Wright ................. H03F 1/3241
330/2
2009/0190647 A1 7/2009 Utsunomiya et al.
(Continued)

FOREIGN PATENT DOCUMENTS

CN 101175061 A 5/2008
CN 101330481 A 12/2008
(Continued)

OTHER PUBLICATIONS

International Search Report mailed Jul. 9, 2014, in corresponding International Application No. PCT/CN2014/075027.
(Continued)

*Primary Examiner* — David B. Lugo
(74) *Attorney, Agent, or Firm* — Staas & Halsey LLP

(57) ABSTRACT

A nonlinear compensating apparatus and method, a transmitter and a communication system are provided. The apparatus includes a preprocessor configured to preprocess a transmitted signal according to a pre-obtained preprocessing coefficient and a predistorter configured to perform predistortion for the preprocessed signal, and a result of comparison of a characteristic parameter of the signal that has been preprocessed and then predistorted with that of the transmitted signal satisfies a predetermined condition. By preprocessing the transmitted signal at the transmitter end, the embodiments of the present disclosure may perform efficient nonlinear compensation only needing to measure at the transmitter end and without needing to perform many times of measurement at the receiver end, and may lower complexity of circuits of the communication system and complexity of calculation.

10 Claims, 12 Drawing Sheets

(56) References Cited

U.S. PATENT DOCUMENTS

| | | | |
|---|---|---|---|
| 2009/0262862 A1* | 10/2009 | Chen | H04L 27/2614 375/298 |
| 2010/0001795 A1 | 1/2010 | Shi et al. | |
| 2011/0221527 A1* | 9/2011 | Woo | H03F 1/3247 330/149 |
| 2011/0316623 A1* | 12/2011 | Bohn | H03F 1/0227 330/127 |
| 2012/0286985 A1 | 11/2012 | Chandrasekaran et al. | |
| 2014/0003553 A1* | 1/2014 | Lozhkin | H03F 1/3241 375/297 |

FOREIGN PATENT DOCUMENTS

| | | |
|---|---|---|
| CN | 101499781 A | 8/2009 |
| CN | 101621305 A | 1/2010 |
| CN | 102394846 A | 3/2012 |

OTHER PUBLICATIONS

Chinese Office Action dated Nov. 28, 2016 in corresponding Chinese Patent Application No. 201310128976.2.

* cited by examiner

NONLINEAR COMPENSATING APPARATUS AND METHOD, TRANSMITTER AND COMMUNICATION SYSTEM

CROSS REFERENCE TO RELATED APPLICATIONS

This application is a continuation of International Application No. PCT/CN2014/075027, filed Apr. 10, 2014, and claims the benefit of Chinese Application No. 201310128976.2, filed Apr. 15, 2013, the disclosures of all of which are incorporated herein by reference.

TECHNICAL FIELD

The present disclosure relates to the field of communications, and in particular to a nonlinear compensating apparatus and method in a communication system, a transmitter and a communication system.

BACKGROUND

Currently, in a communication system, transmission of a transmitted signal at a data transmitter end via the communication system produces nonlinear distortion resulted from a nonlinear effect in the communication system, thereby resulting in degradation of communication quality.

In the prior art, nonlinear distortion produced in signal transmission is generally compensated for by performing predistortion at a data transmitter end, so as to improve communication quality. And a nonlinear compensating coefficient used in the predistortion may be obtained in a direct learning method or an indirect learning method. However, either the direct learning method or the indirect learning method needs to measure signals at the data receiver end many times after the signals pass through the communication system, and perform many times of iteration calculation based on the signals at the data transmitter end and the signals at the data receiver end. Hence, complexity of circuits of the whole communication system and complexity of calculation are greatly increased.

It should be noted that the above description of the background is merely provided for clear and complete explanation of the present disclosure and for easy understanding by those skilled in the art. And it should not be understood that the above technical solution is known to those skilled in the art as it is described in the background of the present disclosure.

SUMMARY

An object of the embodiments of the present disclosure is to provide a nonlinear compensating apparatus and method, which may efficiently compensate for nonlinear distortion produced in a communication process, thereby improving communication quality, and lowering complexity of circuits of the communication system and complexity of calculation.

According to an aspect of the embodiments of the present disclosure, there is provided a nonlinear compensating apparatus, including: a preprocessor configured to preprocess a transmitted signal according to a pre-obtained preprocessing coefficient; and a predistorter configured to perform predistortion for the preprocessed signal; wherein a result of comparison of a characteristic parameter of the signal that has been preprocessed and then predistorted with that of the transmitted signal satisfies a predetermined condition.

According to another aspect of the embodiments of the present disclosure, there is provided a nonlinear compensating method, including: preprocessing a transmitted signal according to a pre-obtained preprocessing coefficient; performing predistortion for the preprocessed signal; wherein a result of comparison of a characteristic parameter of the signal that has been preprocessed and then predistorted with that of the transmitted signal satisfies a predetermined condition.

An advantage of the embodiments of the present disclosure exists in that nonlinear distortion produced in a communication process is efficiently compensated, and complexity of circuits of the communication system and complexity of calculation are lowered.

With reference to the following description and drawings, the particular embodiments of the present disclosure are disclosed in detail, and the principles of the present disclosure and the manners of use are indicated. It should be understood that the scope of the embodiments of the present disclosure is not limited thereto. The embodiments of the present disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprise/include" when used in this specification is taken to specify the presence of stated features, integers, steps or components but does not preclude the presence or addition of one or more other features, integers, steps, components or groups thereof.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. To facilitate illustrating and describing some parts of the disclosure, corresponding portions of the drawings may be exaggerated or reduced in size. Elements and features depicted in one drawing or embodiment of the disclosure may be combined with elements and features depicted in one or more additional drawings or embodiments. Moreover, in the drawings, like reference numerals designate corresponding parts throughout the several views and may be used to designate like or similar parts in more than one embodiment. In the drawings.

DETAILED DESCRIPTION

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited correspondingly in scope. Rather, the disclosure includes all changes, modifications and equivalents coming within the terms of the appended claims.

Figure 1:
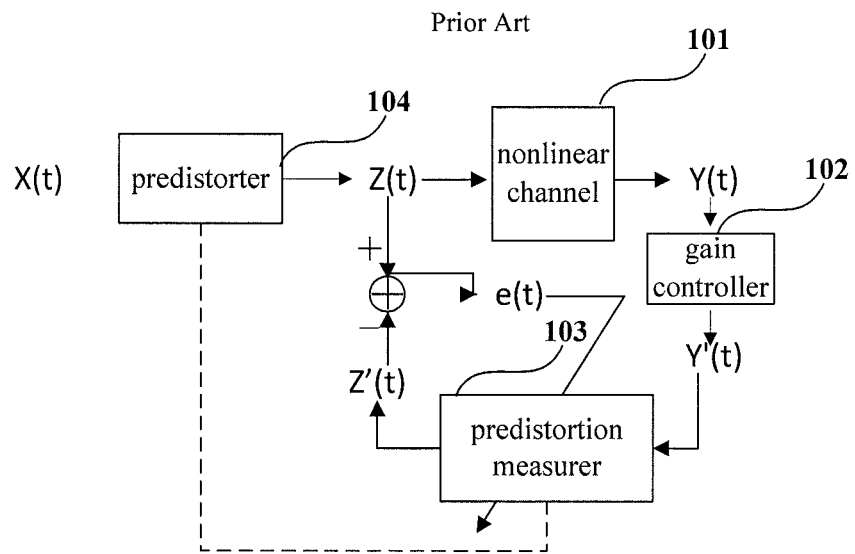
FIG. 1 is a flowchart of performing nonlinear compensation by a nonlinear compensating apparatus in the prior art.

Currently, a nonlinear compensating apparatus and method in the prior art need to perform many times of iteration calculation based on the signals at the data transmitter end and the signals at the data receiver end. FIG. 1 is a flowchart of performing nonlinear compensation by a nonlinear compensating apparatus in the prior art. As shown in FIG. 1, the nonlinear compensating apparatus includes a nonlinear channel 101, a gain controller 102, a predistortion measurer 103 and a predistorter 104. For example, the predistortion measurer 103 and the predistorter 104 are completely the same; and X(t) is a transmitted signal, Z(t) is a predistorted signal, a received signal Y(t) is obtained by transmitting the Z(t) via the nonlinear channel 101, a signal Y'(t) is obtained by performing gain control on the Y(t) by the gain controller 102, power of the signal Y'(t) being identical to that of the transmitted signal X(t).

A nonlinear compensating coefficient needed by the predistorter 104 in performing predistortion is obtained by repeated measurements by the predistortion measurer 103, and in performing measurement for the first time, the predistorter 104 is removed, hence, X(t) is identical to Z(t). According to the signal Z(t) and the signal Y'(t), the predistortion measurer 103 may calculate an initial parameter of the predistortion measurer 103, and the predistorter 104 is incorporated into the nonlinear compensating apparatus after calculating the initial parameter. The transmitted signal X(t) is again inputted into the nonlinear compensating apparatus, so as to obtain the signal Y'(t), a signal Z'(t) is obtained after the signal Y'(t) passes through the predistortion measurer 103, and the parameter of the predistortion measurer 103 is adjusted by comparing the signal Z'(t) with the signal Z(t); the adjusted predistortion measurer 103 is copied to a position of the predistorter 104; and the above processes are repeated, until a difference e(t) between Z'(t) and the signal Z(t) is in a predefined range.

Figure 2A:
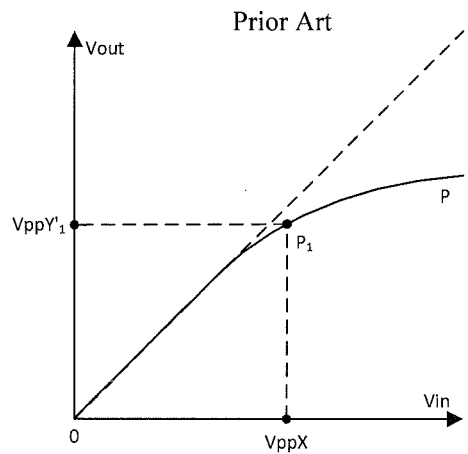
FIG. 2(a) is an input-output curve diagram of a nonlinear channel 101 in FIG. 1.
Figure 2B:
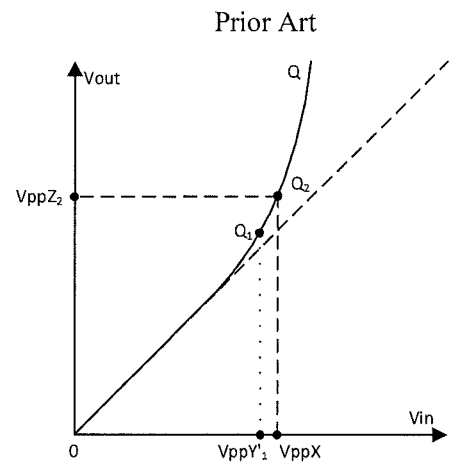
FIG. 2(b) is an input-output curve diagram of a predistortion measurer 103 and a predistorter 104 in FIG. 1.

FIG. 2(a) is an input-output curve diagram of the nonlinear channel 101 in FIG. 1, and FIG. 2(b) is an input-output curve diagram of the predistortion measurer 103 and the predistorter 104 in FIG. 1. As shown in FIG. 2(a), a curve 0-P is an input-output curve of the nonlinear channel 101. In measurement for the first time, a range of the input signal X(t) is 0-VppX, and a range of the output signal Y'(t) is 0-VppY'1, corresponding to a 0-P1 part of the curve; and these may be used to obtain the input-output curve 0-Q1 of the predistortion measurer 103 and the predistorter 104 in FIG. 2(b).

In a normal case, VppY'1<VppX, hence when input of the predistorter 104 is 0-VppX, a corresponding input-output curve is a 0-Q2 part in FIG. 2(b). A Q1-Q2 part in the input-output curve has not been measured, hence, measurement needs to be performed again, until the whole input-output curve 0-Q in FIG. 2(b) to which the curve 0-P in FIG. 2(a) corresponds is measured.

It can be seen that the nonlinear compensating apparatus in the prior art needs to repeatedly measure signals of a receiver end in obtaining a nonlinear compensating coefficient, and calculates repeatedly based on the signals at the data transmitter end and the signals at the data receiver end. Hence, complexity of circuits of the whole communication system and complexity of calculation are greatly increased.

The embodiments of the present disclosure provide a nonlinear compensating apparatus and method, which may efficiently compensate for nonlinear distortion produced in a communication process, thereby improving communication quality, and lowering complexity of circuits of the communication system and complexity of calculation.

Corresponding to FIG. 2(b), the nonlinear compensating apparatus and method provided by the embodiments of the present disclosure may use only the part 0-Q1 in the input-output curve, hence efficient nonlinear compensation may be performed without needing to perform measurement at the receiver end for many times, thereby greatly lowering complexity of circuits of the communication system and complexity of calculation.

The nonlinear compensating apparatus and method of the present disclosure shall be described in detail below with reference to the accompanying drawings.

Embodiment 1

Figure 3:
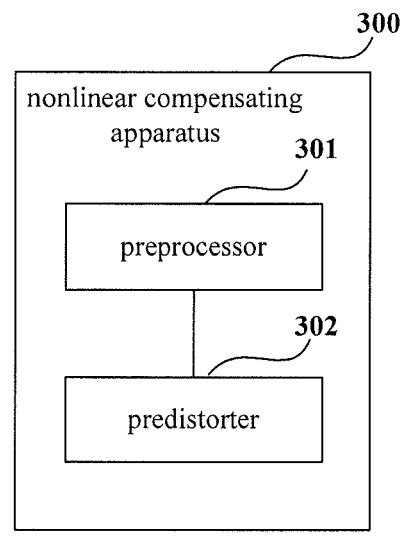
FIG. 3 is a schematic diagram of a structure of a nonlinear compensating apparatus 300 of Embodiment 1 of the present disclosure.

FIG. 3 is a schematic diagram of a structure of the nonlinear compensating apparatus 300 of Embodiment 1 of the present disclosure, the apparatus being provided at a UE (user equipment) side. As shown in FIG. 3, the apparatus 300 includes a preprocessor 301 and a predistorter 302.

The preprocessor 301 is configured to preprocess a transmitted signal X(t) according to a pre-obtained preprocessing coefficient, so as to obtain a preprocessed signal X'(t); and the predistorter 302 is configured to perform predistortion for the preprocessed signal X'(t), so as to obtain a predistorted signal Z(t); so that a result of comparison of a characteristic parameter of the signal that has been preprocessed and then predistorted with that of the transmitted signal satisfies a predetermined condition.

In this embodiment, a received signal Y(t) obtained at a receiver end is approximately identical to the preprocessed signal X'(t) (which are completely identical in an ideal case), and the original transmitted signal X(t) may be well recovered by performing inverse transform on the preprocessing of the received signal Y(t).

In this embodiment, the signal that has been preprocessed and then predistorted is made to be identical to the transmitted signal by preprocessing and then predistorting the transmitted signal. In practical use, taking such factors as equipment precision, and calculation precision, etc. into account, the characteristic parameter of the signal that has been preprocessed and then predistorted is generally not completely identical to that of the transmitted signal. Thus, by comparing the characteristic parameter of the signal that has been preprocessed and then predistorted with that of the transmitted signal, it may be deemed that a compensation requirement is satisfied when the result of comparison satisfies the predetermined condition.

For example, characteristic parameters, that is, indices, such as one or more of power, amplitude and mean values, of the signal Z(t) that has been preprocessed and then predistorted and the transmitted signal X(t) may be compared; however, the present disclosure is not limited to such indices. For example, a ratio of the amplitude of the two signals may be compared; when the ratio is equal to 1, the amplitude of the two signals is completely identical, and this is a most ideal case; and when the ratio is in a predefined range (for example, $1-e^{-5} \sim 1+e^{-5}$), it may be deemed that the compensation requirement is satisfied. For another example, a difference between the mean values of the two signals may be compared; when the difference is equal to 0, the mean values of the two signals are completely identical, and this is a most ideal case; and when the difference is in a predefined range (for example, $-e^{-5} \sim e^{-5}$), it may be deemed that the compensation requirement is satisfied. For a further example, the amplitude and the mean values of the two signals may be compared at the same time, and when the ratio of the amplitude and the difference between the mean values are in the above ranges respectively, it may be deemed that the compensation requirement is satisfied. The comparison of the characteristic parameters of the two signals is illustrated above, the present disclosure is not limited to these characteristic parameters and parameter ranges, and the parameter ranges may be determined according to an actual situation.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

Embodiment 2

Figure 4:
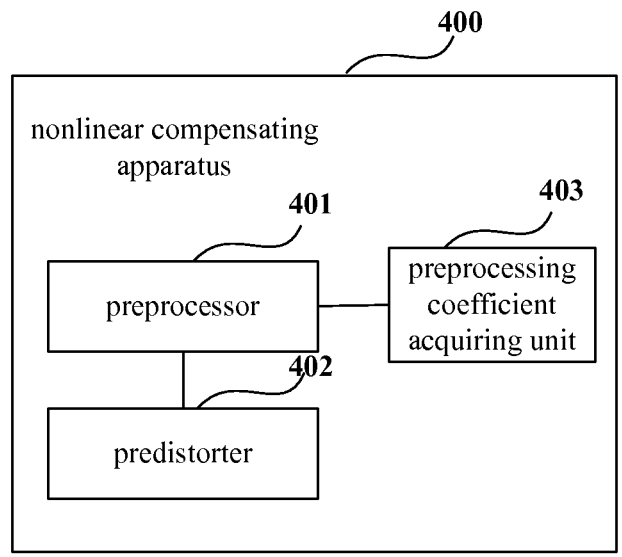
FIG. 4 is a schematic diagram of a structure of a nonlinear compensating apparatus 400 of Embodiment 2 of the present disclosure.

FIG. 4 is a schematic diagram of a structure of a nonlinear compensating apparatus 400 of Embodiment 2 of the present disclosure, the apparatus being provided at a transmitter end of a signal. As shown in FIG. 4, the apparatus 400 includes a preprocessor 401, a predistorter 402 and a preprocessing coefficient acquiring unit 403.

The preprocessor 401 is configured to preprocess a transmitted signal X(t) according to a pre-obtained preprocessing coefficient, so as to obtain a preprocessed signal X'(t); and the predistorter 402 is configured to perform predistortion for the preprocessed signal X'(t), so as to obtain a predistorted signal Z(t); so that a result of comparison of a characteristic parameter of the predistorted signal Z(t) with that of the transmitted signal X(t) satisfies a predetermined condition;

and the preprocessing coefficient acquiring unit 403 is configured to determine a preprocessing coefficient used by the preprocessor 401 in preprocessing the transmitted signal.

In this embodiment, the preprocessing coefficient is, for example, a zooming coefficient and/or a translating coefficient; however, the present disclosure is not limited thereto.

In this embodiment, the structure of the preprocessor 401, the structure of the preprocessing coefficient acquiring unit 403 and the method for acquiring the preprocessing coefficient by using the preprocessor 401 and the preprocessing coefficient acquiring unit 403 shall be described with reference to FIGS. 5-8, which shall not be described herein any further, and the present disclosure is not limited to such structures and method.

Figure 5:
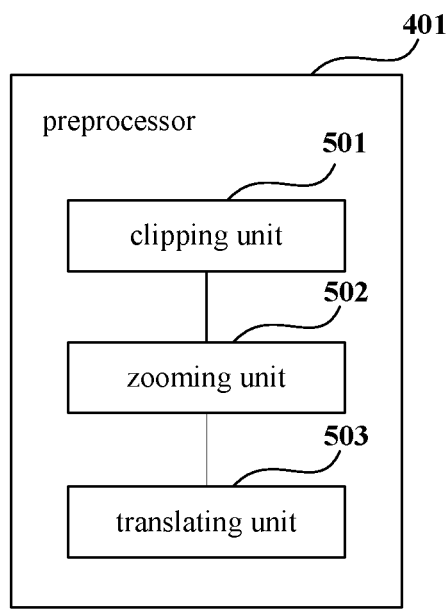
FIG. 5 is a schematic diagram of a structure of a preprocessor 401 in FIG. 4.

In this embodiment, the preprocessor 401 is configured to preprocess the transmitted signal, so that the result of comparison of the characteristic parameter of the predistorted signal Z(t) with that of the transmitted signal X(t) satisfies the predetermined condition. The characteristic parameter is, for example, power, amplitude and a mean value of a signal. Corresponding to a characteristic parameter needing to be compared, the structure of the preprocessor 401 is set. For example, when the amplitude of the signal needs to be compared, a zooming unit configured to adjust the amplitude is correspondingly provided in the preprocessor 401; and when the mean value of the signal needs to be compared, a translating unit configured to adjust the mean value is correspondingly provided in the preprocessor 401. FIG. 5 is a schematic diagram of the structure of the preprocessor 401 in FIG. 4, corresponding to a case where amplitude and means values of signals needs to be compared at the same time; however, the present disclosure is not limited to such a structure.

As shown in FIG. 5, the preprocessor 401 includes a clipping unit 501, a zooming unit 502 and a translating unit 503.

The clipping unit 501 is configured to clip a part of the amplitude of the transmitted signal X(t) that is greater than a predetermined value; r is a predetermined clipping coefficient; for example, the clipping coefficient may be a numerical value taken from $\sqrt{10} \sim 4$; however, the present disclosure is not limited to numerical values in this range. For example, if a mean square root value of the transmitted signal X(t) is k, after being clipped by the clipping unit 501, the amplitude of the signal X(t) greater than r×K or less than −r×K will be compulsively set to be r×K or −r×K. A process of clipping the transmitted signal X(t) shall be described with reference to FIG. 8, and shall not be described herein any further.

The zooming unit 502 is configured to perform zooming on the amplitude of the clipped signal according to a pre-obtained zooming coefficient, and the translating unit 503 is configured to perform translation on a mean value of the zoomed signal according to a pre-obtained translating coefficient.

In this embodiment, the linear processing including the zooming processing and the translation processing by using the zooming unit 502 and the translating unit 503 may possibly have effect on a signal to noise ratio of the communication system under a condition of noise, hence for example the clipping unit 501 may be provided, so that the predistorted signal obtains a balance between a clipped noise and lowering of the signal to noise ratio brought about by lowering of power, thereby achieving a better compensation result.

Figure 6:
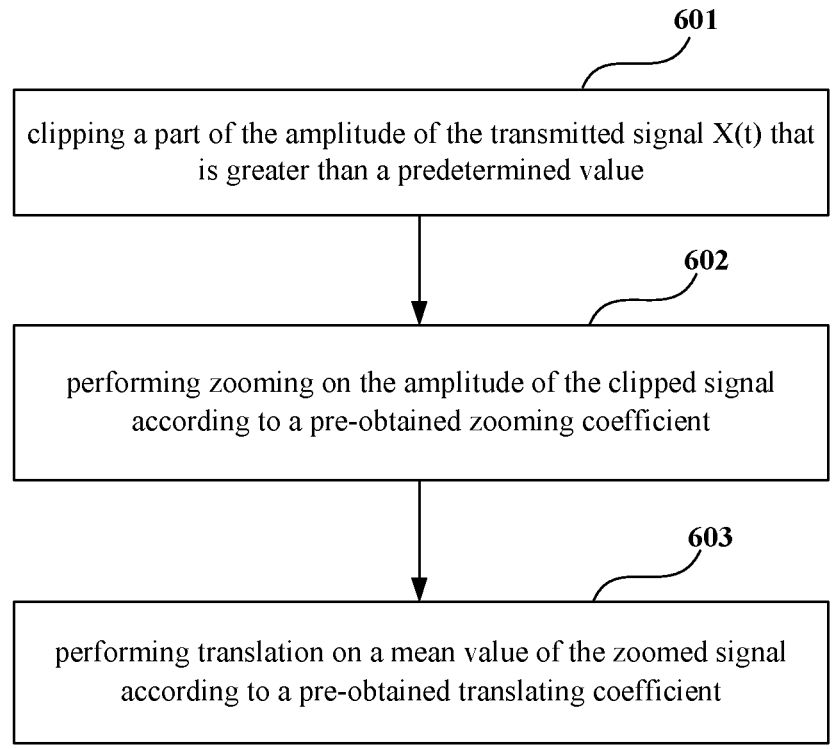
FIG. 6 is a flowchart of a method of preprocessing a transmitted signal by the preprocessor 401.

FIG. 6 is a flowchart of a method for preprocessing the transmitted signal by the preprocessor 401. As shown in FIG. 6, the method includes:

step 601: clipping a part of the amplitude of the transmitted signal X(t) that is greater than a predetermined value;

step 602: performing zooming on the amplitude of the clipped signal according to a pre-obtained zooming coefficient; and step 603: performing translation on a mean value of the zoomed signal according to a pre-obtained translating coefficient.

In this embodiment, the zooming unit 502 and the translating unit 503 is configured to perform zooming and translation on the amplitude and the mean value of the clipped signal according to the pre-obtained zooming coefficient and translating coefficient, the predistorter 402 is configured to perform predistortion for the zoomed and translated signal, and based on results of comparison of the amplitude and mean values of the signal that is preprocessed and then predistorted and the transmitted signal, the preprocessing coefficient acquiring unit 403 is configured to adjust the zooming coefficient and translating coefficient, until the results of comparison of the amplitude and mean values of the signal that is preprocessed and then predistorted and the transmitted signal satisfy the predetermined condition, and is configured to determine a zooming coefficient and a translating coefficient used when the predetermined condition is satisfied as the zooming coefficient and translating coefficient, thereby acquiring the preprocessing coefficient.

In this embodiment, the predetermined condition is identical to that in Embodiment 1, and shall not be described herein any further.

Figure 7:
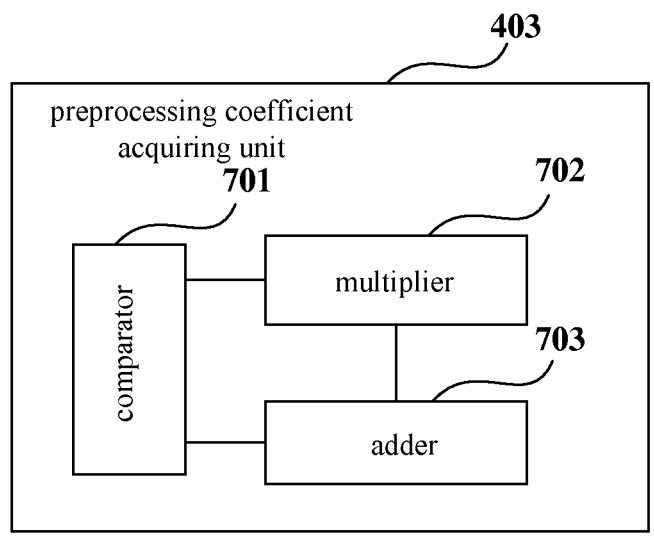
FIG. 7 is a schematic diagram of a structure of a preprocessing coefficient acquiring unit 403 in FIG. 4.

FIG. 7 is a schematic diagram of a structure of the preprocessing coefficient acquiring unit 403 in FIG. 4; however, the present disclosure is not limited to such a structure. As shown in FIG. 7, the preprocessing coefficient acquiring unit 403 includes a comparator 701, a multiplier 702 and an adder 703.

The preprocessing coefficient acquiring unit 403 is configured to adjust the zooming coefficient and translating coefficient for N times, so that the results of comparison of the amplitude and mean values of the predistorted signal Z(t)N and the transmitted signal X(t) obtained after N times of adjustment satisfy the predetermined condition; where, N is an integer greater than or equal to 1.

The comparator 701 is configured to compare the amplitude of a predistorted signal of an i-th time of adjustment in the N times of adjustment with that of the transmitted signal, so as to obtain an amplitude error parameter of the i-th time of adjustment, and compare a mean value of the predistorted signal of the i-th time of adjustment with that of the transmitted signal, so as to obtain a mean value error parameter of the i-th time of adjustment; where, $0<i \leq N$.

the multiplier 702 is configured to multiply the amplitude error parameter of the current adjustment by a zooming parameter of an (i−1)-th time of adjustment, so as to obtain the zooming coefficient of the i-th time of adjustment, and multiply the amplitude error parameter of the i-th time of adjustment by the mean value error parameter of the i-th time of adjustment;

and the adder 703 is configured to add a result obtained by the multiplier 702 through multiplying the amplitude error parameter of the i-th time of adjustment by the mean value error parameter of the i-th time of adjustment to the translating coefficient of the (i−1)-th time of adjustment, so as to obtain the translating coefficient of the current adjustment.

Figure 8:
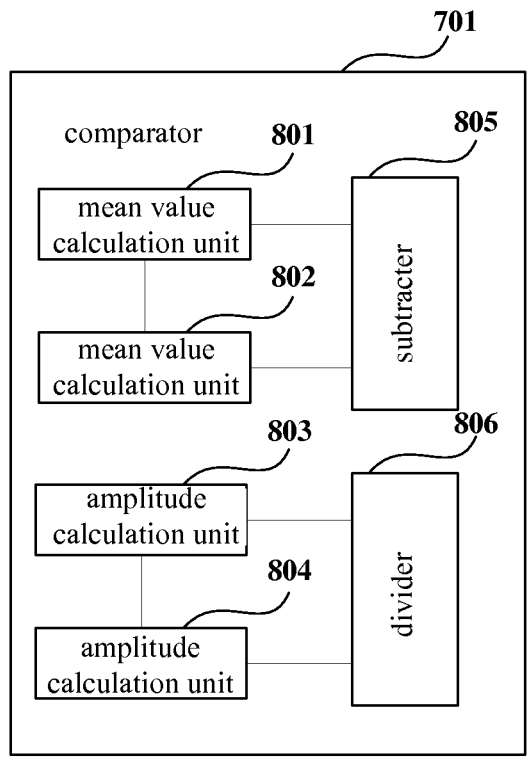
FIG. 8 is a schematic diagram of a structure of a comparator 701 in FIG. 7.

In this embodiment, the comparator 701 is configured to compare the amplitude of the predistorted signal of the i-th time of adjustment in the N times of adjustment with that of the transmitted signal, so as to obtain the amplitude error parameter of the i-th time of adjustment, and compare the mean value of the predistorted signal of the i-th time of adjustment in the N times of adjustment with that of the transmitted signal X(t), so as to obtain the mean value error parameter of the i-th time of adjustment; where, $0<i \leq N$. FIG. 8 is a schematic diagram of a structure of the comparator 701 in FIG. 7; however, the present disclosure is not limited to such a structure. As shown in FIG. 8, the comparator 701 includes mean value calculation units 801 and 802, amplitude calculation units 803 and 804, a subtractor 805 and a divider 806.

The transmitted signal X(t) and a predistorted signal $Z(t)_i$ are input signals of the comparator 701, structures of the mean value calculation units 801 and 802 are identical, the mean value calculation units 801 and 802 respectively calculate mean values of the signal X(t) and the signal Z(t)i, structures of the amplitude calculation units 803 and 804 are also identical, and the amplitude calculation units 803 and 804 respectively calculate amplitude of the signal X(t) and the signal $Z(t)_i$; and the mean values of the signal X(t) and the signal $Z(t)_i$ are subtracted by using the subtracter 805, so as to obtain the mean value error parameter $e_{mean}(t)_i$ of the i-th time of adjustment, and the amplitude of the signal X(t) and the signal $Z(t)_i$ is divided by using the divider 806, so as to obtain the amplitude error parameter $e_{Vpp}(t)_i$ of the i-th time of adjustment.

After the mean value error parameter $e_{mean}(t)_i$ of (t) the i-th time of adjustment and the amplitude error parameter $e_{Vpp}(t)_i$ of the i-th time of adjustment are obtained, the preprocessing coefficient is acquired by using the preprocessing coefficient acquiring unit 403.

Figure 9:
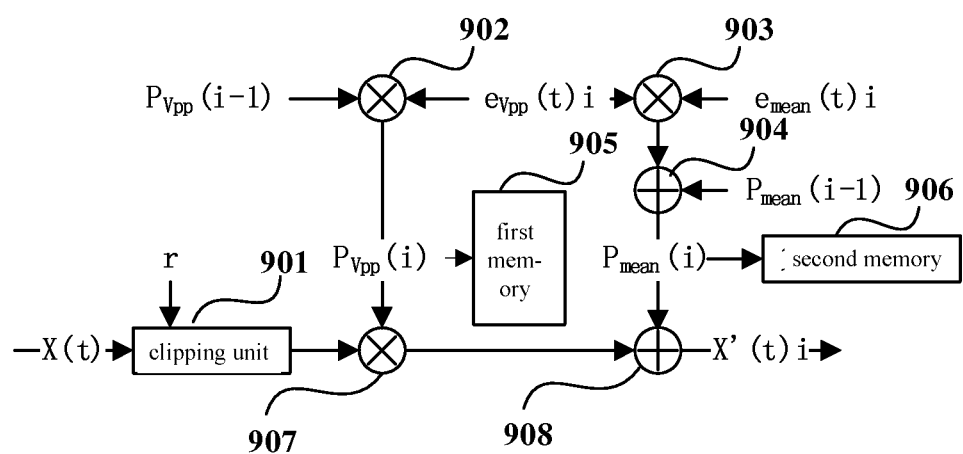
FIG. 9 is a flowchart of a method of acquiring a preprocessing coefficient of Embodiment 2 of the present disclosure.

FIG. 9 is a flowchart of a method of acquiring the preprocessing coefficient by using the preprocessing coefficient acquiring unit 403 of this embodiment; however, the present disclosure is not limited to such a method. As shown in FIG. 9, 901 denotes the clipping unit 501 in FIGS. 5, 902 and 903 denote the multiplier 702 in FIG. 7, 904 denotes the adder 703 in FIG. 7, and 905 and 906 denote respectively a first memory and a second memory; for example, the first memory 905 and the second memory 906 may be provided respectively, and may also be provided integrally; and they may be provided in the preprocessing coefficient acquiring unit 403, and may also be provided in the nonlinear compensating apparatus 400, independent of the preprocessing coefficient acquiring unit 403; 907 denotes the zooming unit 502 in FIG. 5, which may be, for example, a multiplier, in this embodiment; and 908 denotes the translating unit 503 in FIG. 5, which may be, for example, an adder, in this embodiment.

The first memory 905 is configured to store the zooming parameter, an initial value of the zooming parameter being, for example, 1; and the second memory 906 is configured to store the translating parameter, an initial value of the translating parameter being, for example, 0. When the zooming unit 502 and the translating unit 503 is configured to perform the i-th time of adjustment in the N times of adjustment, the amplitude error parameter $e_{V_{pp}}(t)_i$ of the i-th time of adjustment obtained in FIG. 8 is multiplied by the zooming parameter $P_{V_{pp}}(i-1)$ of the (i−1)-th time of adjustment by using the multiplier 902, so as to obtain a zooming coefficient $P_{V_{pp}}(i)$ of the i-th time of adjustment, and store it in the first memory 905; the signal obtained by clipping the transmitted signal X(t) by the clipping unit 901 is multiplied by the zooming coefficient $P_{V_{pp}}(i)$ of the i-th time of adjustment by using the multiplier 907, that is, adjustment of the amplitude is performed, so as to obtain a zoomed signal of the i-th time of adjustment; the amplitude error parameter $e_{V_{pp}}(t)_i$ of the i-th time of adjustment obtained in FIG. 8 is multiplied by the mean value error parameter $e_{mean}(t)_i$ of the i-th time of adjustment by using the multiplier 903, and a result of multiplication is added to the translating coefficient $P_{mean}(i-1)$ of an (i−1)-th time of adjustment by using the adder 904, so as to obtain the translating coefficient $P_{mean}(i)$ of the i-th time of adjustment, and store it in the second memory 906; the amplitude adjusted signal of the i-th time is added to the translating coefficient $P_{mean}(i)$ of the i-th time of adjustment by using the adder 908, so as to obtain the mean value translated signal $X'(t)_i$ of the i-th time; the signal $X'(t)_i$ is distorted by the predistorter 402, so as to obtain a distorted signal $Z'(t)_i$; and the above process is repeated, until the results of comparison of the amplitude and mean values of the signal $Z'(t)_N$ obtained after N times of adjustment and the transmitted signal X(t) satisfy the predetermined condition. When the results of comparison satisfy the predetermined condition, a zooming coefficient $P_{V_{pp}}(N)$ and a translating coefficient $P_{mean}(N)$ of N times of adjustment are taken as the preprocessing coefficients and provided to the preprocessor 401 for preprocessing.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

Embodiment 3

Figure 10:
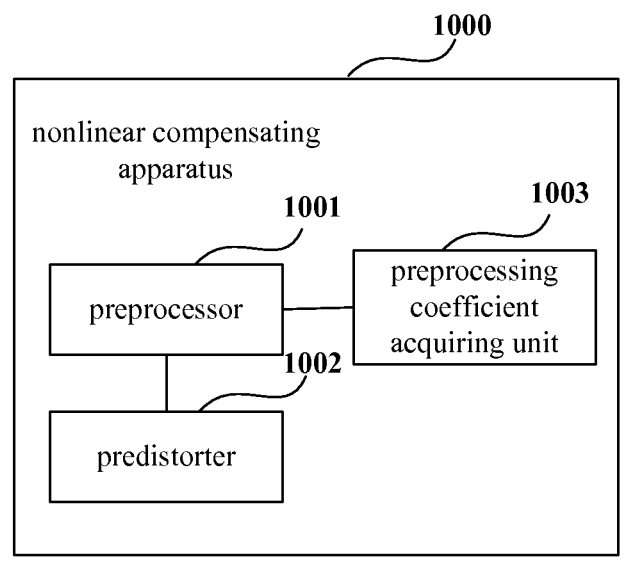
FIG. 10 is a schematic diagram of a structure of a nonlinear compensating apparatus 1000 of Embodiment 3 of the present disclosure.

FIG. 10 is a schematic diagram of a structure of a nonlinear compensating apparatus 1000 of Embodiment 3 of the present disclosure, the apparatus being provided at a transmitter end of a signal. As shown in FIG. 10, the apparatus 1000 includes a preprocessor 1001, a predistorter 1002 and a preprocessing coefficient acquiring unit 1003.

The preprocessor 1001 is configured to preprocess a transmitted signal X(t) according to a pre-obtained preprocessing coefficient, so as to obtain a preprocessed signal X'(t); and the predistorter 1002 is configured to perform predistortion for the preprocessed signal X'(t), so as to obtain a predistorted signal Z(t); so that a result of comparison of a characteristic parameter of the predistorted signal Z(t) with that of the transmitted signal X(t) satisfies a predetermined condition;

and the preprocessing coefficient acquiring unit 1003 is configured to determine a preprocessing coefficient used by the preprocessor 1001 in preprocessing the transmitted signal.

In this embodiment, different from Embodiment 2, only the amplitude of the predistorted signal Z(t) is compared with that of the transmitted signal X(t), and correspondingly, the preprocessor 1001 includes a clipping unit and a zooming unit, and the preprocessing coefficient is a zooming coefficient only; however, the present disclosure is not limited to such a case.

In this embodiment, the predetermined condition is identical to that in Embodiment 1, and shall not be described herein any further.

Figure 11:
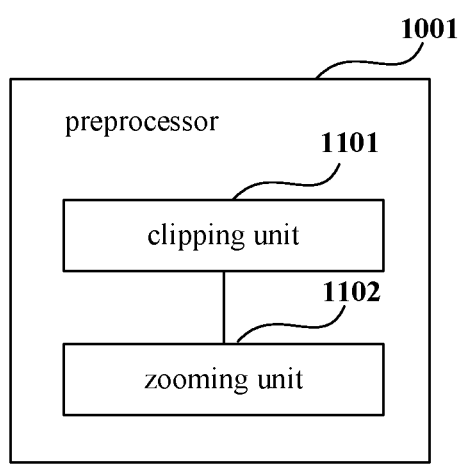
FIG. 11 is a schematic diagram of a structure of a preprocessor 1001 in FIG. 10.

FIG. 11 is a schematic diagram of a structure of the preprocessor 1001 in FIG. 10, corresponding to a case where amplitude of signals is compared; however, the present disclosure is not limited to such a structure.

As shown in FIG. 11, the preprocessor 1001 includes a clipping unit 1101 and a zooming unit 1102.

The clipping unit 1101 is identical to that described in Embodiment 2, and shall not be described herein any further.

The zooming unit 1102 is configured to perform zooming on the amplitude of the clipped signal according to a pre-obtained zooming coefficient. In this embodiment, the linear processing including the zooming processing by using the zooming unit 1102 may possibly have effect on a signal to noise ratio of the communication system under a condition of noise, hence for example the clipping unit 1101 may be provided, so that the nonlinear compensated signal obtains a balance between a clipped noise and lowering of the signal to noise ratio brought about by lowering of power, thereby achieving a better compensation result.

Figure 12:
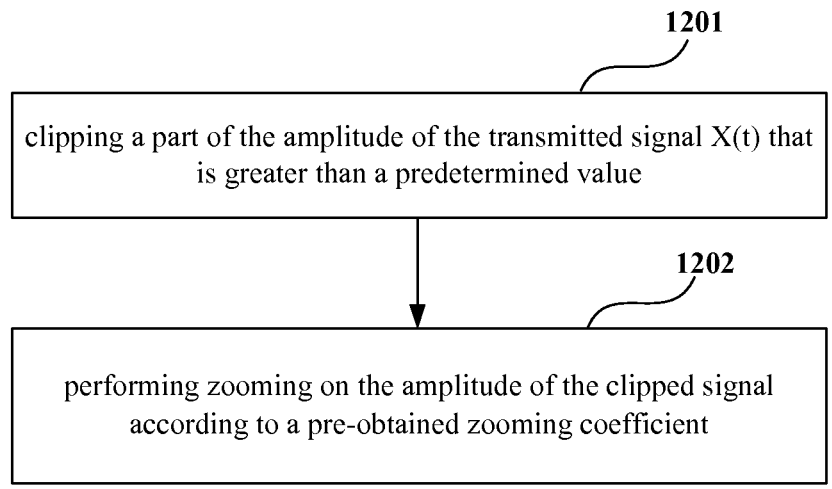
FIG. 12 is a flowchart of a method of preprocessing a transmitted signal by the preprocessor 1001 in FIG. 10.

FIG. 12 is a flowchart of a method for preprocessing the transmitted signal by the preprocessor 1001. As shown in FIG. 12, the method includes:

step 1201: clipping a part of the amplitude of the transmitted signal X(t) that is greater than a predetermined value; and step 1202: performing zooming on the amplitude of the clipped signal according to a pre-obtained zooming coefficient.

Figure 13:
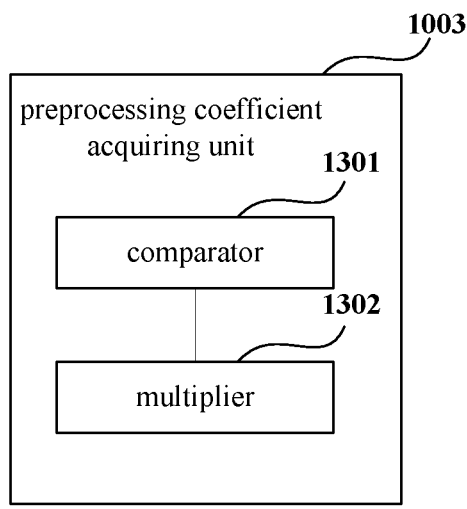
FIG. 13 is a schematic diagram of a structure of a preprocessing coefficient acquiring unit 1003 in FIG. 10.

FIG. 13 is a schematic diagram of a structure of a preprocessing coefficient acquiring unit 1003 in FIG. 10; however, the present disclosure is not limited to such a structure. As shown in FIG. 13, the preprocessing coefficient acquiring unit 1003 includes a comparator 1301 and a multiplier 1302.

The comparator 1301 is configured to compare amplitude of a nonlinear compensated signal of an i-th time of adjustment in N times of adjustment with that of the transmitted signal, so as to obtain an amplitude error parameter of the i-th time of adjustment; where, $0 < i \leq N$;

and the multiplier 1302 is configured to multiply the amplitude error parameter of the i-th time of adjustment by a zooming parameter of an (i−1)-th time of adjustment, so as to obtain the zooming coefficient of the current time.

In this embodiment, the zooming unit 1102 is configured to perform zooming on the amplitude of the clipped signal according to the pre-obtained zooming coefficient, the predistorter 1002 is configured to perform predistortion for the zoomed signal, and based on a result of comparison of the amplitude of the signal that is preprocessed and then predistorted and the transmitted signal, the preprocessing coefficient acquiring unit 1003 is configured to adjust the zooming coefficient, until the result of comparison of the amplitude of the signal that is preprocessed and then predistorted and the transmitted signal satisfy the predetermined condition, and is configured to determine a zooming coefficient used when the predetermined condition is satisfied as the zooming coefficient, thereby acquiring the preprocessing coefficient.

In this embodiment, the predetermined condition is identical to that described in Embodiment 1, and shall not be described herein any further.

Figure 14:
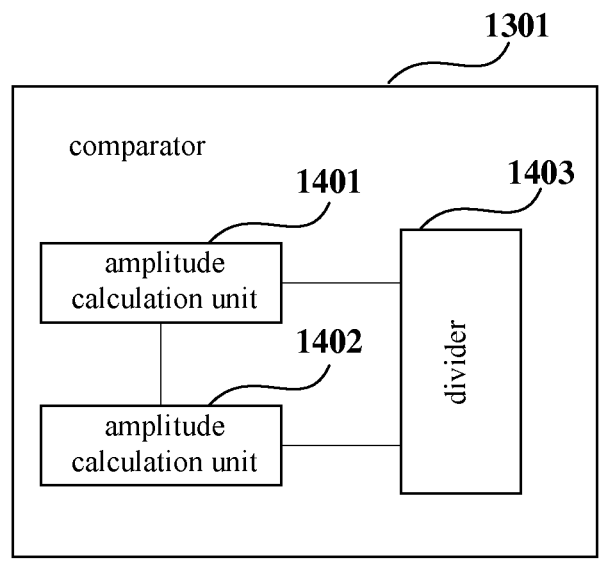
FIG. 14 is a schematic diagram of a structure of a comparator 1301 in FIG. 13.

In this embodiment, the comparator 1301 is configured to compare the amplitude of the predistorted signal of the i-th time of adjustment in the N times of adjustment with that of the transmitted signal, so as to obtain the amplitude error parameter of the i-th time of adjustment; where, $0<i\le N$. FIG. 14 is a schematic diagram of a structure of the comparator 1301 in FIG. 13; however, the present disclosure is not limited to such a structure. As shown in FIG. 14, the comparator 1301 includes amplitude calculation units 1401 and 1402, and a divider 1403.

The transmitted signal X(t) and a nonlinear compensated signal $Z(t)_i$ are input signals of the comparator 1301, structures of the amplitude calculation units 1401 and 1402 are identical, and the amplitude calculation units 1401 and 1402 respectively calculate amplitude of the signal X(t) and the signal $Z(t)_i$; and the amplitude of the signal X(t) and the signal $Z(t)_i$ is divided by using the divider 1403, so as to obtain the amplitude error parameter $e_{V_{pp}}(t)_i$ of the i-th time of adjustment.

After the amplitude error parameter $e_{V_{pp}}(t)_i$ of the i-th time of adjustment is obtained, the preprocessing coefficient is acquired by using the preprocessing coefficient acquiring unit 1003.

Figure 15:
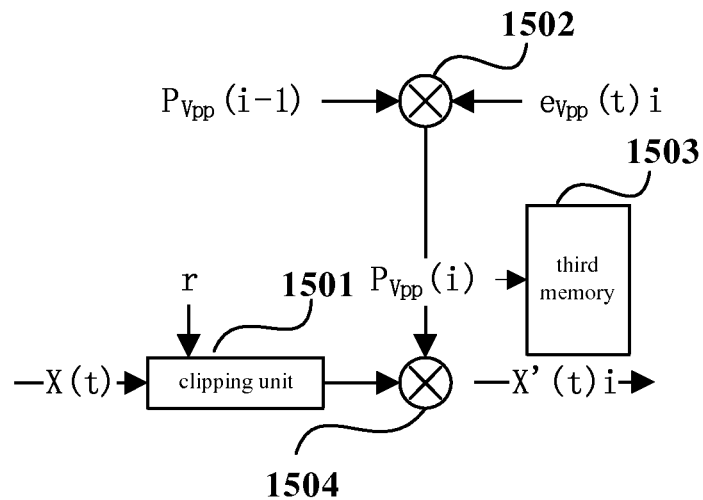
FIG. 15 is a flowchart of a method of acquiring a preprocessing coefficient of Embodiment 3 of the present disclosure.

FIG. 15 is a flowchart of a method of acquiring the preprocessing coefficient by using the preprocessing coefficient acquiring unit 1003 of this embodiment; however, the present disclosure is not limited to such a method. As shown in FIG. 15, 1501 denotes the clipping unit 1101 in FIG. 11, 1502 denotes the multiplier 1302 in FIGS. 13, and 1503 denotes a third memory; for example, the third memory may be provided in the preprocessing coefficient acquiring unit 1003, and may also be provided in the nonlinear compensating apparatus 1000, independent of the preprocessing coefficient acquiring unit 1003; 1504 denotes the zooming unit 1102 in FIG. 11, which may be, for example, a multiplier, in this embodiment.

The third memory 1503 is configured to store the zooming parameter, an initial value of the zooming parameter being, for example, 1. When the zooming unit 1102 is configured to perform the i-th time of adjustment in the N times of adjustment, the amplitude error parameter $e_{V_{pp}}(t)_i$ of the i-th time of adjustment obtained in FIG. 15 is multiplied by the zooming parameter $P_{V_{pp}}(i-1)$ of the (i−1)-th time of adjustment by using the multiplier 1302, so as to obtain a zooming coefficient $P_{V_{pp}}(i)$ of the i-th time of adjustment, and store it in the third memory 1503; the signal obtained by clipping the transmitted signal X(t) by the clipping unit 1501 is multiplied by the zooming coefficient $P_{V_{pp}}(i)$ of the i-th time of adjustment by using the multiplier 1304, that is, adjustment of the amplitude is performed, so as to obtain a zoomed signal $X'(t)_i$ of the i-th time of adjustment; the signal $X'(t)_i$ is distorted by the predistorter 1002, so as to obtain a distorted signal $Z'(t)_i$; and the above process is repeated, until the result of comparison of the amplitude of the signal $Z'(t)_N$ obtained after N times of adjustment and the transmitted signal X(t) satisfy the predetermined condition.

When the result of comparison satisfies the predetermined condition, a zooming coefficient $P_{V_{pp}}(N)$ of N times of adjustment is taken as the preprocessing coefficient and provided to the preprocessor 1001 for preprocessing.

Furthermore, when only the mean value of the nonlinear compensated signal Z(t) is compared with that of the transmitted signal X(t), the preprocessor includes the clipping unit and the translating unit, and the preprocessing coefficient includes only the translating coefficient. At this moment, calculation of the translating coefficient in FIG. 9 in Embodiment 2 may only be used, and the part of calculating of the zooming coefficient and the zooming unit may be removed.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

Embodiment 4

Figure 16:
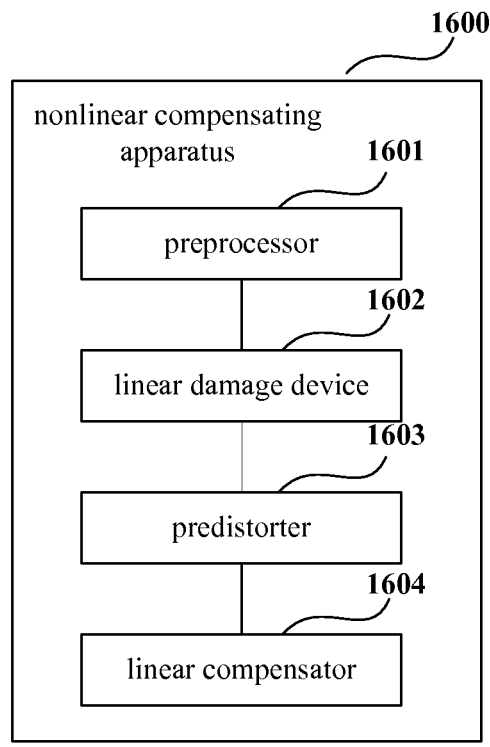
FIG. 16 is a schematic diagram of a structure of a nonlinear compensating apparatus 1600 of Embodiment 4 of the present disclosure.

FIG. 16 is a schematic diagram of a structure of a nonlinear compensating apparatus 1600 of Embodiment 4 of the present disclosure, the apparatus being provided at a transmitter end of a signal. As shown in FIG. 16, the apparatus 1600 includes a preprocessor 1601, a linear damage device 1602, a predistorter 1603 and a linear compensator 1604.

The preprocessor 1601 is configured to preprocess a transmitted signal X(t) according to a pre-obtained preprocessing coefficient, so as to obtain a preprocessed signal; the linear damage device 1602 is configured to perform linear damage processing on the preprocessed signal; the predistorter 1603 is configured to perform predistortion for the linearly damaged signal; and the linear compensator 1604 is configured to linearly compensate for the predistorted signal, so as to obtain a linearly compensated signal; so that a result of comparison of a characteristic parameter of the predistorted signal Z(t) with that of the transmitted signal X(t) satisfies a predetermined condition.

In this embodiment, the linear damage device 1602 and the linear compensator 1604 are reverse to each other, that is, processing of a signal in the linear compensator 1604 is a reverse process of processing of the signal in the linear damage device 1602.

Different from Embodiment 1, a long memory effect resulted from the linear damage in the communication system is removed in this embodiment by providing the mutually reverse linear damage device and linear compensator, so that the nonlinear compensating apparatus only compensates for the nonlinear damage in which relatively short memory is remained, thereby overcoming a problem of power loss resulted from the linear compensation at the transmitter end.

In this embodiment, a received signal Y(t) obtained at a receiver end is approximately identical to the preprocessed signal X'(t) (which are completely identical in an ideal case), and the original transmitted signal X(t) may be well recovered by performing inverse transform on the preprocessing of the received signal Y(t).

In this embodiment, the signal that has been preprocessed and then predistorted is made to be identical to the transmitted signal by preprocessing and then predistorting the transmitted signal. In practical use, taking such factors as equipment precision, and calculation precision, etc. into account, the characteristic parameter of the signal that has been preprocessed and then predistorted is generally not completely identical to that of the transmitted signal. Thus, by comparing the characteristic parameter of the signal that has been preprocessed and then predistorted with that of the transmitted signal, it may be deemed that a compensation requirement is satisfied when the result of comparison satisfies the predetermined condition.

The predetermined condition in this embodiment is identical to that in Embodiment 1, and the process of predistortion in this embodiment is identical to that in Embodiment 2 or 3, which shall not be described herein any further.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

In embodiments 1-4, the predistortion performed by the predistorter may include the nonlinear compensation performed according to the preobtained nonlinear compensation coefficient, and the nonlinear compensation coefficient may be obtained by using any method in the prior art.

Figure 17:
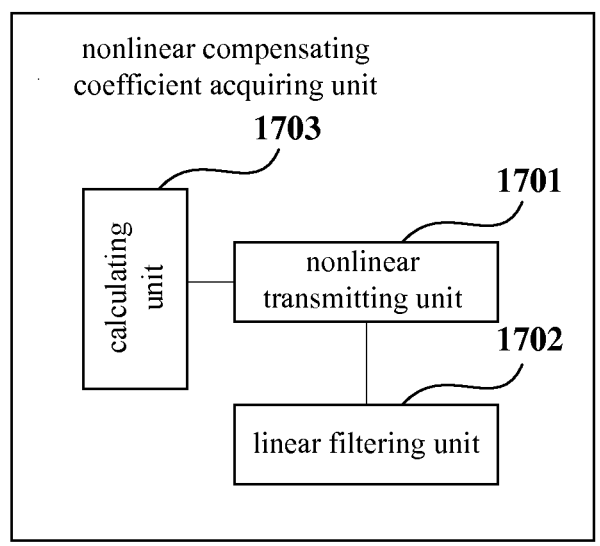
FIG. 17 is a schematic diagram of a structure of a nonlinear compensating coefficient acquiring unit of the present disclosure.

For example, a nonlinear compensating coefficient acquiring unit configured to determine the preobtained nonlinear compensating coefficient may be provided in the nonlinear compensating apparatus 300 (400, 900, 1600), so as to provide the nonlinear compensation coefficient to the predistorter for performing nonlinear compensation. FIG. 17 is a schematic diagram of a structure of the nonlinear compensating coefficient acquiring unit. As shown in FIG. 17, the nonlinear compensating coefficient acquiring unit includes a nonlinear transmitting unit 1701, a linear filtering unit 1702 and a calculating unit 1703;

the nonlinear transmitting unit 1701 and the linear filtering unit 1702 are connected to each other, and an input signal and an output signal of the nonlinear transmitting unit 1701 need to be measured once; and the calculating unit 1703 is configured to obtain the nonlinear compensating coefficient based on the input signal and the output signal of the nonlinear transmitting unit 1701.

The nonlinear transmitting unit 1701 and the linear filtering unit 1702 are simulation models set up for nonlinear distortion and linear distortion in the communication system. As a memory effect is extremely serious in some communication systems (such as optical fiber communication), it is deemed that the memory effect in the communication system is resulted from the linear damage, and the communication system is deemed as a combination of a linear filter and a nonlinear device of no memory or short memory. Thus, the linear filtering unit 1702 and the nonlinear transmitting unit 1701 are provided.

A method for determining a nonlinear compensating coefficient by using the nonlinear compensating coefficient acquiring unit is illustrated below; however, the present disclosure is not limited to such a method.

Figure 18:
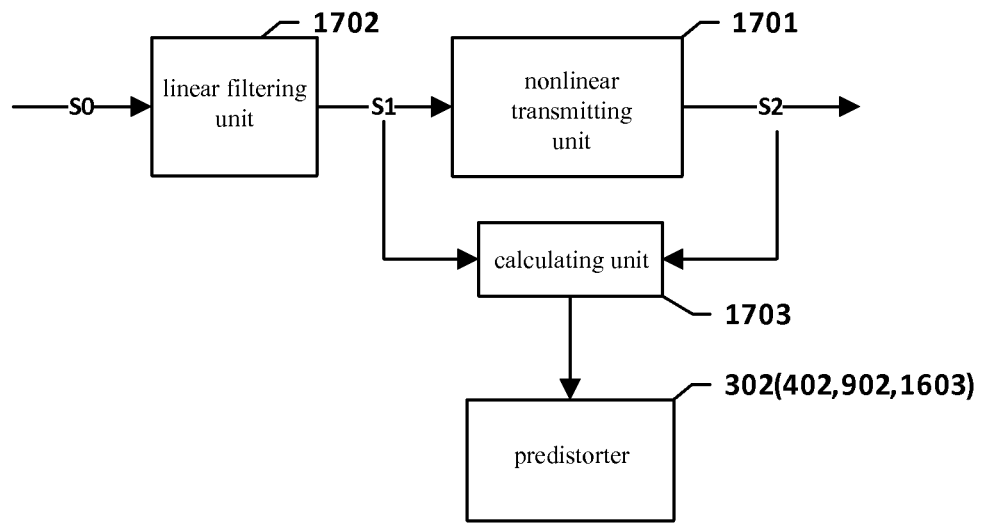
FIG. 18 is a flowchart of a method for determining a nonlinear compensating coefficient by using a nonlinear compensating coefficient acquiring unit.

FIG. 18 is a flowchart of the method for determining the nonlinear compensating coefficient by using the nonlinear compensating coefficient acquiring unit. As shown in FIG. 18, the nonlinear transmitting unit 1701 is provided after the linear filtering unit 1702, and the calculating unit 1703 is configured to calculate the nonlinear compensating coefficient according to the input signal S1 of the nonlinear transmitting unit 1701 and the output signal S2 of the nonlinear transmitting unit 1701. The relevant art may be used for calculating the nonlinear compensating coefficient. For example, a recursive least square (RLS) method or a least mean square (LMS) method may be used to obtain a tap coefficient of the linear filtering unit 1702, and the output signal of the nonlinear transmitting unit 1701 may be obtained according to the input signal of the nonlinear transmitting unit 1701, the output signal of the linear filtering unit 1702 and the tap coefficient. For example, a Volterra expansion method may be employed to determine a nonlinear compensation item, and an initial parameter of the predistorter may be obtained according to the least square method or the least mean square method.

Furthermore, when the nonlinear transmitting unit 1701 is provided before the linear filtering unit 1702, the calculating unit still calculates the nonlinear compensating coefficient according to the input signal of the nonlinear transmitting unit 1701 and the output signal of the nonlinear transmitting unit 1701. And the method of calculation is similar to that described above, and shall not be described herein any further.

It can be seen from the above embodiment that in embodiments 1-4, as the transmitted signal is preprocessed, the nonlinear compensating coefficient may be obtained by performing measurement at the transmitter end once, thereby lowering complexity of circuits of the communication system and complexity of calculation.

Embodiment 5

Figure 19:
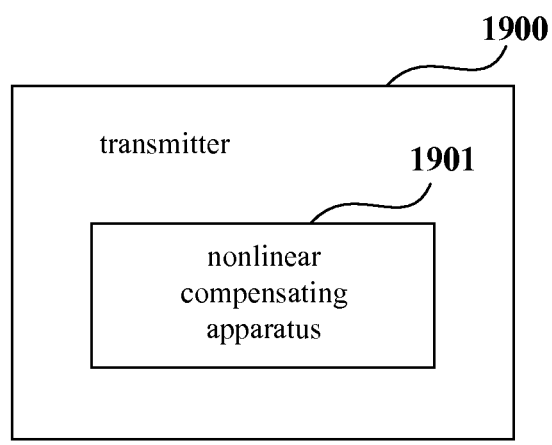
FIG. 19 is a schematic diagram of a structure of a transmitter 1900 of Embodiment 5 of the present disclosure.

FIG. 19 is a schematic diagram of a structure of a transmitter 1900 of Embodiment 5 of the present disclosure. The transmitter 1900 includes the nonlinear compensating apparatus 1901 (300, 400, 900, 1600) in any one of embodiments 1-4.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

Embodiment 6

Figure 20:
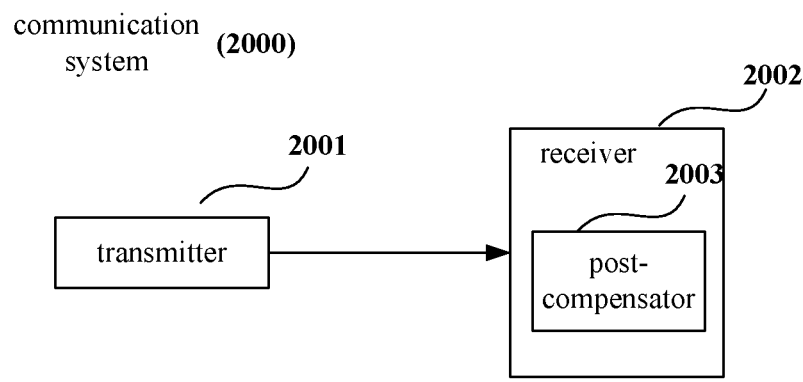
FIG. 20 is a schematic diagram of a structure of a communication system 2000 of Embodiment 6 of the present disclosure.

FIG. 20 is a schematic diagram of a structure of a communication system 2000 of Embodiment 6 of the present disclosure. The communication system 2000 includes the transmitter 2001 (1900) of Embodiment 5 and a receiver 2002.

In this embodiment, the receiver 2002 further includes a post-compensator 2003 configured to perform post nonlinear compensation on a received signal Y(t) according to a result of comparison of the received signal and a signal X'(t) preprocessed at a transmitter end.

In this embodiment, a nonlinear compensating coefficient used by the post-compensator 2003 may be obtained by the nonlinear compensating coefficient acquiring unit shown in FIG. 17. For example, it may also be obtained by using the method shown in FIG. 18, which shall not be described herein any further.

In this embodiment, by providing the post-compensator 2003 at a receiver end, the nonlinear distortion produced in the process of transmission of the compensation signal, thereby improving the communication quality.

Embodiment 7

Figure 21:
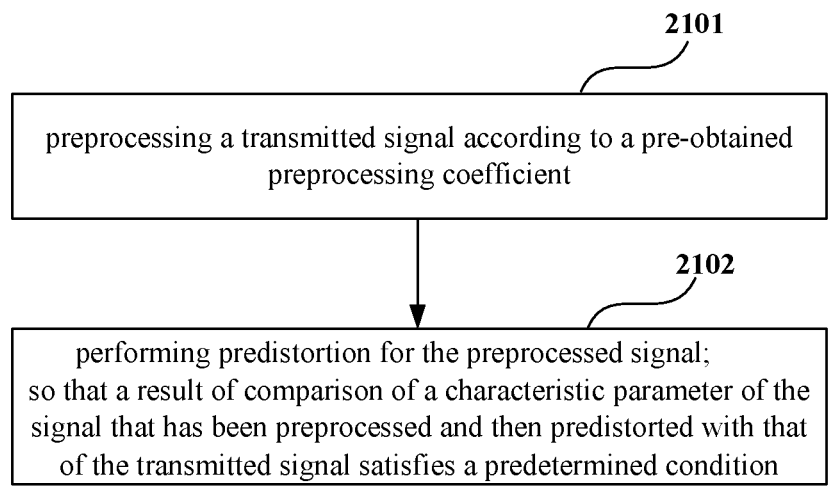
FIG. 21 is a flowchart of a nonlinear compensating method of Embodiment 7 of the present disclosure.

FIG. 21 is a flowchart of a nonlinear compensating method of Embodiment 7 of the present disclosure, corresponding to the nonlinear compensating apparatus of Embodiment 1. As shown in FIG. 21, the method includes:

step 2101: preprocessing a transmitted signal according to a pre-obtained preprocessing coefficient; and step 2102: performing predistortion for the preprocessed signal;

so that a result of comparison of a characteristic parameter of the signal that has been preprocessed and then predistorted with that of the transmitted signal satisfies a predetermined condition.

In this embodiment, a received signal obtained at a receiver end is approximately identical to the preprocessed signal (which are completely identical in an ideal case), and the original transmitted signal may be well recovered by performing inverse transform on the preprocessing of the received signal.

In this embodiment, the signal that has been preprocessed and then predistorted is made to be identical to the transmitted signal by preprocessing and then predistorting the transmitted signal. In practical use, taking such factors as equipment precision, and calculation precision, etc. into account, the characteristic parameter of the signal that has been preprocessed and then predistorted is generally not completely identical to that of the transmitted signal. Thus, by comparing the characteristic parameter of the signal that has been preprocessed and then predistorted with that of the transmitted signal, it may be deemed that a compensation requirement is satisfied when the result of comparison satisfies the predetermined condition.

The predetermined condition in this embodiment is identical to that in Embodiment 1, and the method for obtaining the preprocessing coefficient used in preprocessing in this embodiment is identical to that in Embodiment 2 or 3, which shall not be described herein any further.

In this embodiment, the predistortion may include the nonlinear compensation performed according to the preobtained nonlinear compensation coefficient. And the method for obtaining the nonlinear compensation coefficient in this embodiment is identical to that in embodiments 1-4, which shall not be described herein any further.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

Embodiment 8

Figure 22:
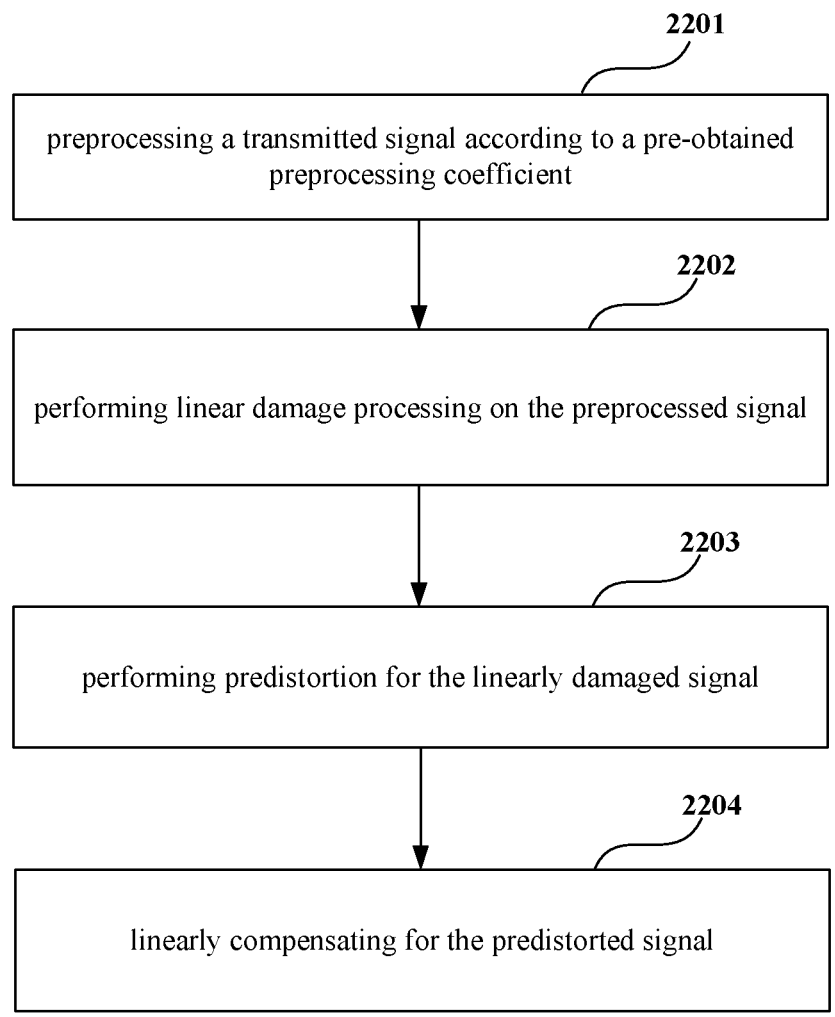
FIG. 22 is a flowchart of a nonlinear compensating method of Embodiment 8 of the present disclosure.

FIG. 22 is a flowchart of a nonlinear compensating method of Embodiment 8 of the present disclosure, corresponding to the nonlinear compensating apparatus of Embodiment 4. As shown in FIG. 22, the method includes:

step 2201: preprocessing a transmitted signal according to a pre-obtained preprocessing coefficient;

step 2202: performing linear damage processing on the preprocessed signal;

step 2203: performing predistortion for the linearly damaged signal;

step 2204: linearly compensating for the predistorted signal;

so that a result of comparison of a characteristic parameter of the predistorted signal with that of the transmitted signal satisfies a predetermined condition.

In this embodiment, a received signal obtained at a receiver end is approximately identical to the preprocessed signal (which are completely identical in an ideal case), and the original transmitted signal may be well recovered by performing inverse transform on the preprocessing of the received signal.

In this embodiment, the signal that has been preprocessed and then predistorted is made to be identical to the transmitted signal by preprocessing and then predistorting the transmitted signal. In practical use, taking such factors as equipment precision, and calculation precision, etc. into account, the characteristic parameter of the signal that has been preprocessed and then predistorted is generally not completely identical to that of the transmitted signal. Thus, by comparing the characteristic parameter of the signal that has been preprocessed and then predistorted with that of the transmitted signal, it may be deemed that a compensation requirement is satisfied when the result of comparison satisfies the predetermined condition.

The predetermined condition in this embodiment is identical to that in Embodiment 1, the method for obtaining the preprocessing coefficient used in preprocessing in this embodiment is identical to that in Embodiment 2 or 3, and the descriptions of linear damage processing and linear compensation in this embodiment are identical to that in Embodiment 4, which shall not be described herein any further.

In this embodiment, the predistortion may include the nonlinear compensation performed according to the preobtained nonlinear compensation coefficient. And the method for obtaining the nonlinear compensation coefficient in this embodiment is identical to that in embodiments 1-4, which shall not be described herein any further.

It can be seen from the above embodiment that by preprocessing the transmitted signal at the transmitter end, measurement is only needed to be performed at the transmitter end and many times of measurement at the receiver end are not needed to be performed, thereby efficiently compensating for nonlinear distortion produced in a communication process, improving communication quality, and lowering complexity of circuits of the communication system and complexity of calculation.

The above apparatuses and methods of the present disclosure may be implemented by hardware, or by hardware in combination with software. The present disclosure relates to such a computer-readable program that when the program is executed by a logic device, the logic device is enabled to carry out the apparatus or components as described above, or to carry out the methods or steps as described above.

The present disclosure also relates to a storage medium for storing the above program, such as a hard disk, a floppy disk, a CD, a DVD, and a flash memory, etc.

The present disclosure is described above with reference to particular embodiments. However, it should be understood by those skilled in the art that such a description is illustrative only, and not intended to limit the protection scope of the present disclosure. Various variants and modifications may be made by those skilled in the art according to the principles of the present disclosure, and such variants and modifications fall within the scope of the present disclosure.

The invention claimed is:

1. A nonlinear compensating apparatus, comprising:
a preprocessor configured to preprocess a transmitted signal according to a pre-obtained preprocessing coefficient to produce a preprocessed signal; and
a predistorter configured to perform predistortion for the preprocessed signal to produce a predistorted signal;
wherein the preprocess and predistortion is repeated until a result of comparison of a characteristic parameter of the transmitted signal that has been preprocessed to produce the preprocessed signal and then predistorted to produce the predistorted signal with that of the transmitted signal satisfies a predetermined condition,
and the processing coefficient comprises one or both of a zooming coefficient and a translating coefficient,
wherein the apparatus further comprises:
a first processor configured to determine the one or both of the zooming coefficient and the translating coefficient according to the transmitted signal, one or both of a predetermined initial zooming coefficient and a predetermined initial translating coefficient and the predistorted signal,
wherein the first processor is further configured to perform linear damage processing on the preprocessed signal to produce a linear damage processed signal, and input the linear damage processed signal into the predistorter; and
linearly compensate for a linear damaged signal that is linear damage processed and then predistorted.

2. The apparatus according to claim 1, wherein the characteristic parameter comprises one or more of power, amplitude and a mean value of one of power and amplitude;
and when the preprocessing coefficient comprises the zooming coefficient and the translating coefficient, the preprocessor comprises:
a second processor configured to clip a part of the amplitude of the transmitted signal greater than a predetermined value to produce a clipped signal,
perform zooming on the amplitude of the clipped signal according to the zooming coefficient to produce a zoomed signal; and
perform translation on a mean value of the zoomed signal according to the pre-obtained translating coefficient.

3. The apparatus according to claim 2, wherein
the second processor is configured to perform one or both of zooming and translation on the one or both of amplitude and a mean value of the clipped signal according to the one or both of the predetermined initial zooming coefficient and the initial translating coefficient,
the predistorter is configured to perform predistortion for the one or both of zoomed and translated signal, and
the first processor is configured to adjust the one or both of the zooming coefficient and the translating coefficient based on a result of comparison of a characteristic parameter of the signal that has been preprocessed and then predistorted with that of the transmitted signal, until the result of comparison of the characteristic parameter of the signal that has been preprocessed and then pre-distorted with that of the transmitted signal satisfies a predetermined condition, and determine one or both of the zooming coefficient and the translating coefficient used when the predetermined condition is satisfied as the one or both of the zooming coefficient and the translating coefficient.

4. The apparatus according to claim 3, wherein the first processor comprises a comparator, a multiplier and an adder, or the first processor comprises a comparator and a multiplier;
and wherein in the process of adjusting the one of the zooming coefficient and the first processor,
the comparator is configured to one of compare the amplitude of a nonlinear compensated signal of a current adjustment with that of the transmitted signal, so as to obtain an amplitude error parameter of the current adjustment, and compare the mean value of the nonlinear compensated signal of the current adjustment with that of the transmitted signal, so as to obtain a mean value error parameter of the current adjustment;
the multiplier is configured one of to multiply the amplitude error parameter of the current adjustment by a zooming parameter of preceding adjustment, so as to obtain the zooming coefficient of the current adjustment, and to multiply the amplitude error parameter of the current adjustment by the mean value error parameter of the current adjustment;
and the adder is configured to add a result obtained by the multiplier through multiplying the amplitude error parameter of the current adjustment by the mean value error parameter of the current adjustment to the translating coefficient of the preceding adjustment, so as to obtain the translating coefficient of the current adjustment.

5. The apparatus according to claim 1, wherein the predistorting the preprocessed signal by the predistorter comprises nonlinear compensating for the preprocessed signal;
and the first processor is further configured to determine a nonlinear compensating coefficient used by the predistorter in nonlinear compensating.

6. The apparatus according to claim 5, wherein,
the first processor comprises a nonlinear transmitter, a linear filter and a calculator;
and wherein the nonlinear transmitter and the linear filter are connected to each other, and the calculator is configured to obtain the nonlinear compensating coefficient based on an input signal and an output signal of the nonlinear transmitter.

7. A transmitter, comprising the apparatus as claimed in claim 1.

8. A communication system, comprising the transmitter as claimed in claim 7 and a receiver, the receiver comprising a post-compensator, the post-compensator being configured to nonlinear compensate for a received signal according to a result of comparison of the received signal and the preprocessed signal transmitted by the transmitter.

9. The apparatus according to claim 1, wherein the characteristic parameter comprises one or more of power, amplitude and a mean value of one of power and amplitude;
and when the preprocessing coefficient comprises only the zooming coefficient, the preprocessor comprises:
a second processor configured to clip a part of the amplitude of the transmitted signal greater than a predetermined value to produce a clipped signal; and
perform zooming on the amplitude of the clipped signal according to the zooming coefficient.

10. The apparatus according to claim 1, wherein the characteristic parameter comprises one or more of power, amplitude and a mean value of one of power and amplitude;

and when the preprocessing coefficient comprises only the translating coefficient, the preprocessor comprises:
a second processor configured to clip a part of the amplitude of the transmitted signal greater than a predetermined value to produce a clipped signal; and
perform translation on a clip mean value of the clipped signal according to the translating coefficient.

* * * * *